(12) United States Patent
Singha et al.

(10) Patent No.: US 9,786,408 B2
(45) Date of Patent: Oct. 10, 2017

(54) RENEWABLE HYDROCARBON BASED INSULATING FLUID

(71) Applicant: ABB Schweiz AG, Baden (CH)

(72) Inventors: Santanu Singha, Västerås (SE); Gal Brandes, Berlin (DE); Donald Cherry, South Boston, VA (US); Clair Claiborne, Apex, NC (US); Stephane Page, Grenolier (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/764,342

(22) PCT Filed: Feb. 20, 2014

(86) PCT No.: PCT/EP2014/053354
§ 371 (c)(1),
(2) Date: Jul. 29, 2015

(87) PCT Pub. No.: WO2014/128227
PCT Pub. Date: Aug. 28, 2014

(65) Prior Publication Data
US 2015/0364229 A1    Dec. 17, 2015

(30) Foreign Application Priority Data
Feb. 21, 2013 (EP) .................................. 13156209

(51) Int. Cl.
| | | |
|---|---|---|
| C09K 5/00 | (2006.01) |
| H01B 3/22 | (2006.01) |
| H01B 17/34 | (2006.01) |
| H01F 27/10 | (2006.01) |
| H01G 2/08 | (2006.01) |
| H01G 4/04 | (2006.01) |
| H01H 9/52 | (2006.01) |
| H02K 9/19 | (2006.01) |
| H05K 7/20 | (2006.01) |

(52) U.S. Cl.
CPC ............... *H01B 3/22* (2013.01); *H01B 17/34* (2013.01); *H01F 27/105* (2013.01); *H01G 2/08* (2013.01); *H01G 4/04* (2013.01); *H01H 9/52* (2013.01); *H02K 9/19* (2013.01); *H05K 7/20236* (2013.01)

(58) Field of Classification Search
None
See application file for complete search history.

(56) References Cited

U.S. PATENT DOCUMENTS

| | | |
|---|---|---|
| 2002/0139962 A1 | 10/2002 | Fefer et al. |
| 2008/0146469 A1 | 6/2008 | Sato et al. |

FOREIGN PATENT DOCUMENTS

| | | |
|---|---|---|
| WO | 2006060269 A2 | 6/2006 |
| WO | 2012116783 A2 | 9/2012 |
| WO | 2012141784 A1 | 10/2012 |

OTHER PUBLICATIONS

European Search Report Application No. EP 13 15 6209 dated Oct. 22, 2013; dated Oct. 29, 2013 4 pages.
(Continued)

*Primary Examiner* — Necholus Ogden, Jr.
(74) *Attorney, Agent, or Firm* — Whitmyer IP Group LLC

(57) ABSTRACT

Electrical equipment including insulating fluid and having isoparaffins derived from a renewable carbon source, the fluid having a flash point of at least 210° C. and comprising at least 70 wt % of the isoparaffins. The electrical equipment can be installed and operated subsea.

19 Claims, 1 Drawing Sheet

(56) References Cited

OTHER PUBLICATIONS

International Search Report and Written Opinion of the International Searching Authority Application No. PCT/EP2014/053354 dated Jul. 28, 2014; dated Aug. 5, 2014 6 pages.

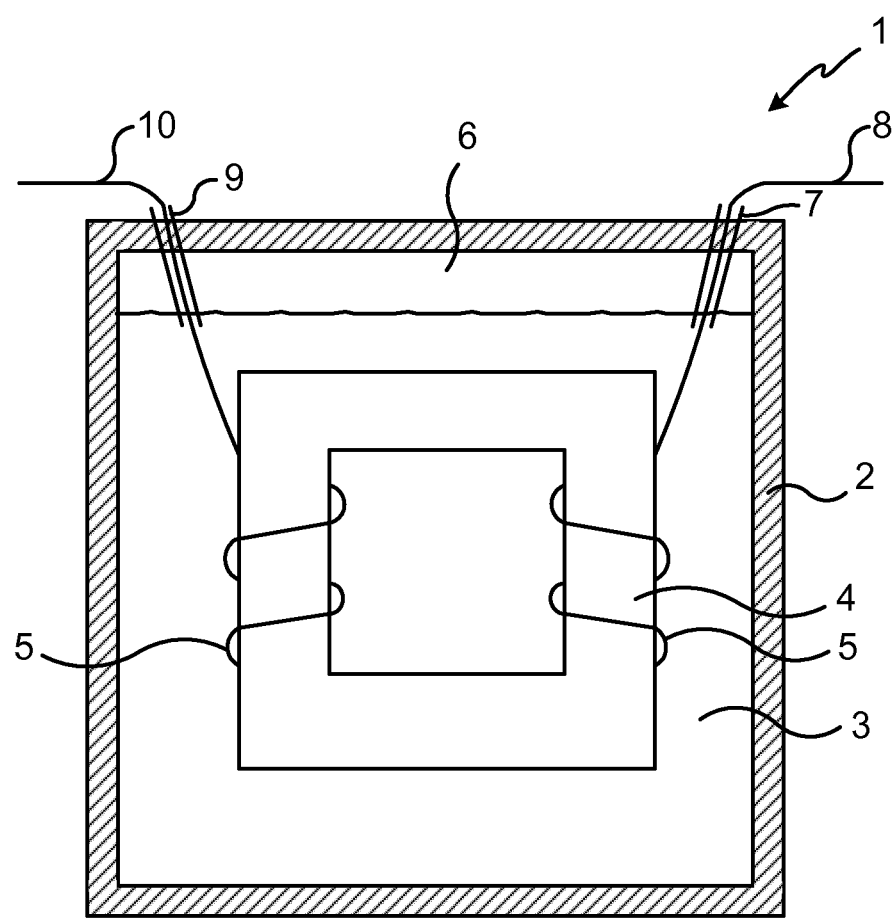

RENEWABLE HYDROCARBON BASED INSULATING FLUID

FIELD OF THE INVENTION

The present disclosure relates to an electrically insulating fluid used in electrical equipment.

BACKGROUND OF THE INVENTION

Liquid or gaseous electrically insulating fluids are used in electrical apparatuses such as transformers, capacitors, switchgear, bushings, etc., and have a multitude of functions. Insulating, dielectric, fluids typically act as an electrically insulating medium separating the high voltage and the grounded parts within the apparatus and function as a cooling medium to transfer the heat generated in the current-carrying conductors. Additionally, analysis of the fluids provides a means to monitoring the health of an electrical equipment during operation.

In addition to the above mentioned basic functions, the insulating fluid should also comply with other necessary and desired requirements. The fluid when used in electrical equipment should contribute to a high efficiency, longer operational life time, and minimal environmental impact. Further, the fluid has to be compatible with the materials used in the electrical equipment and it should not constitute a hazard for the health and safety of personnel. In practice, insulating fluids should exhibit various physical, electrical, and chemical properties. All of these properties are regulated through standards and specifications that stipulate requirements for each one. In particular the flash and fire points of the fluid should be high enough for avoiding fire during faults in the electrical apparatus in which it is used.

Traditionally, petroleum-based oils have been used as the insulating fluid in fluid-filled transformers mainly because of the advantageous properties relating to low viscosity, low pour point, high dielectric strength, easy availability and low cost. During the last couple of decades, the transformer industry has been undergoing several changes. The market demand for compact and efficient transformers with guaranteed long-term performance coupled with the problems of corrosive sulphur and oil quality issues have warranted the need for enhancement in the properties of transformer fluids. Further, strict environmental regulations towards health and safety have been steadily evolving and the increased liability risks in the case of transformer fires or outages have raised a cause for concern. Mineral oils have poor biodegradability, have relatively low fire points and therefore they are not environmentally friendly and fire-safe. Considering these aspects, ester-based dielectric fluids have been gaining lots of attention for liquid-filled transformer applications, especially for distribution class transformers.

Today, the best alternative to mineral oil is ester liquids. Esters are advantageous due to their high biodegradability and high fire/flash points (>300° C.). Some of their properties e.g. high kinematic viscosity and more importantly their high cost have restricted their extensive use in electrical applications. In view of the global push for a clean, safe and healthy environment, there is need for insulating fluid with dielectric/physical properties similar to mineral oils and biodegradability and fire-point significantly higher than mineral oils, but also which is available at a cost similar to that of mineral oil.

Regarding biodegradability, there are no specific methods to test the biodegradability of dielectric liquids. One of the commonly used methods is the OECD 301B, the so-called modified Sturm test. The test is based on the degradation of a chemical in a nutrient solution by a mixture of microorganisms obtained from the environment. The $CO_2$ evolved when the substance is completely oxidized is used to classify whether a substance is biodegradable or bioresistant. A substance is considered readily biodegradable if 60% $CO_2$ evolves from the mixture in 10 days of incubation which is counted from the day when 10% of $CO_2$ evolution is attained. The test must end in 28 days. A substance is considered biodegradable if 60% $CO_2$ evolves by the end of 28 days using the same methodology of counting days as described above. Otherwise the substance is considered bioresistant.

Isoparaffin refers to a group of branched saturated hydrocarbons, also known as alkanes.

There are processes for producing saturated hydrocarbons from unsaturated hydrocarbons, e.g. as set out in the US document below.

US 2008/146469 discloses a process for producing a saturated aliphatic hydrocarbon prepared using an alpha-olefin as a raw material, including the steps of: producing a vinylidene olefin by dimerizing the alpha-olefin in the presence of a metallocene complex catalyst; further dimerizing the vinylidene olefin in the presence of an acid catalyst; and hydrogenating the obtained dimer. Further, there is provided a lubricant composition containing the saturated aliphatic hydrocarbon compound produced by the process.

WO 2012/141784 discloses isoparaffins derived from hydrocarbon terpenes such as myrcene, ocimene and farnesene, and methods for making the same. The isoparaffins have utility as lubricant base stocks.

Terpenes are organic compounds produced by many different plants. Terpenes are derived biosynthetically from units of isoprene, where a terpene is a molecule formed by a plurality of linked isoprene units. Traditionally, all natural compounds built up from isoprene subunits and for the most part originating from plants are denoted as terpenes. Sometimes, terpenes are also referred as isoprenoids. In nature terpenes occur predominantly as hydrocarbons, alcohols and their glycosides, ethers, aldehydes, ketones, carboxylic acids etc.

WO 2012/116783 discloses a yeast cell and the use of said cell for the production of one or more terpene(s). Further, the document relates to methods of generating said cell and the production of one or more terpene(s) and a pharmaceutical or cosmetical composition, a lubricant or transformer oil comprising said terpene(s).

SUMMARY OF THE INVENTION

It is an objective of the present invention to provide a more environmentally friendly electrical insulating fluid than the previously used petroleum based fluids for use in electrical equipment.

According to an aspect of the present invention, there is provided a use of an electrical insulating fluid comprised of isoparaffins in electrical equipment. The isoparaffins are derived from a renewable carbon source. The fluid has a flash point of at least 210° C. and comprised of at least 70 wt % of isoparaffins.

According to another aspect of the present invention, there is provided an electrical equipment comprising an electrically insulating fluid comprising isoparaffins derived from a renewable carbon source, the fluid having a flash point of at least 210° C. and comprising at least 70 wt % of the isoparaffins.

The inventors have realised that by deriving isoparaffins from a renewable carbon source, and not as is usually done from a petroleum or mineral oil source, an isoparaffin mix which is more suitable for use as an insulating fluid in electrical equipment can be obtained. The resulting fluid has a high flash point of at least 210° C. or at least 220° C., as compared with isoparaffin fluid obtained from mineral oil which typically has a flash point in the range of 140-170° C. To obtain an isoparaffin fluid with a higher flash point from mineral oil, expensive and wasteful refining of the isoparaffins is needed, which is undesirable. Also, the resulting fluid has a high content of isoparaffins, at least 70% by weight, wherein the rest is made up of other carbon compounds, e.g., naphthenic or aromatic compounds, any additives, and other impurities. The high isoparaffin content in combination with the mix of other compounds in the fluid derived from a renewable carbon source, gives the fluid a high biodegradability, higher than an isoparaffin fluid from a mineral oil source, making the fluid of the present invention more environmentally friendly.

Interestingly, the fluid comprising isoparaffins has lower viscosity and higher thermal conductivity under high pressure. The combined effect of a lower viscosity and higher thermal conductivity of the electrically insulating fluid comprising isoparaffins at high pressures, compared to the commonly used esters or oils, makes the electrically insulating fluid particularly suitable for subsea power electrical applications.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. The use of "first", "second" etc. for different features/components of the present disclosure are only intended to distinguish the features/components from other similar features/components and not to impart any order or hierarchy to the features/components.

BRIEF DESCRIPTION OF THE DRAWINGS

Embodiments will be described, by way of example, with reference to the accompanying drawings, in which:

FIG. 1 is a schematic side sectional view of an embodiment of an electrical transformer in accordance with the present invention.

DETAILED DESCRIPTION OF THE INVENTION

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art. Like numbers refer to like elements throughout the description.

Base oils, e.g. isoparaffins can be derived from terpene feedstocks by reacting them with olefin co-monomers (see e.g. 2. WO 2012/141784). To generate isoparaffins, a hydrocarbon terpene feedstock is coupled with one or more olefin co-monomers in the presence of a catalyst to form one or more branched alkenes. These branched alkenes are then hydrogenated to form one or more isoparaffins. An interesting aspect of these derived isoparaffins is that the terpene feedstocks can be produced from a renewable source and their properties can be tuned by selecting the right type of olefin co-monomer and terpene for the reaction.

Isoparaffin fluids have been developed for electrical insulation purpose and today, isoparaffin oils for transformer applications are both commercially available and also under development. Isoparaffins can be produced through different processes, e.g. refining of crude oil or by gas to oil (GTL) technologies. Although isoparaffins derived from crude oil have desirable properties with respect to viscosity and pour points, they have only marginally higher biodegradability compared to existing mineral oils and low fire/flash point values.

In some embodiments, the insulating fluid comprises at least 90 wt % of the isoparaffins. This even higher isoparaffin content may improve the flash point and the biodegradability of the fluid even further. In some embodiments, the fluid has a biodegradability of at least 65%, which is higher than a corresponding isoparaffin fluid derived from mineral oil. Biodegradability may be measured in accordance the OECD 301B. In some embodiments the fluid is readily biodegradable in accordance the OECD 301B.

In some embodiments, the isoparaffins have been derived from the renewable carbon source by means of micro organisms or algae, such as bacteria, yeast or algae. Biological production, at least in one stage, of the isoparaffins and the isoparaffin fluid may be convenient and more environmentally friendly than regular chemical synthesis. See e.g. the microbial methods of WO 2012/141784 and WO 2012/116783 mentioned in the background.

In some embodiments, the isoparaffins have been derived from terpenes or unsaturated compounds obtained from the renewable carbon source. In these embodiments, the isoparaffins are derived from the renewable carbon source, via terpenes or (other) unsaturated compounds. The terpenes may first be derived from the renewable carbon source and then, the isoparaffins are derived from said terpenes, or the terpenes may be part of the renewable carbon source. Terpenes may be convenient compounds to produce isoparaffins from (see e.g. the method of WO 2012/141784). Thus, in some embodiments, the isoparaffins have been derived from terpenes by means of micro organisms or algae, such as bacteria, yeast or algae.

In some embodiments, the renewable carbon source is biomass, such as sugar cane, molasses or cellulose pulp. However, any renewable carbon source, as opposed to fossil carbon sources, is contemplated for the present invention.

In some embodiments, the fluid has a pour point of less than −25° C. in accordance with ASTM D 5950. A low temperature pour point is advantageous in electrically insulating fluids for use in electrical equipment, and may be obtained with a fluid in accordance with the present invention.

In some embodiments, the fluid has a kinematic viscosity at 100° C. in the range 2-10 cSt (centi Stokes or mm$^2$/s). Such a kinematic viscosity is advantageous in electrically insulating fluids in electrical equipment, and may be obtained with a fluid in accordance with the present invention.

In some embodiments, the fluid also comprises an additive, such as an antioxidant or a pour point depressant. The isoparaffins may be combined with any suitable additives for improving properties of the insulating fluid for the application in which the fluid is used.

In some embodiments, the electrical equipment is an electrical transformer, an electrical motor, a capacitor, a circuit breaker pole, a frequency converter, a reactor or a bushing. The fluid is envisioned to be advantageously used in transformers, but also used in electrical motors or other electrical equipment, especially high temperature apparatuses.

FIG. 1 is a schematic illustration of an embodiment of an electrical equipment of the present invention, here in the form of an electrical transformer (1). The transformer (1) has housing (2) containing the electrical parts of the transformer immersed in an insulating fluid (3). The electrically insulating fluid (3) is in accordance with any embodiment thereof discussed herein, having a flash point of at least 210° C. and comprising at least 70 wt % of the isoparaffins. At the top of the transformer 1, a gas, e.g. air, phase (6) may be present within the housing and above a top surface of a liquid fluid (3). The electrical parts of the transformer (1) comprises a metal core (4) surrounded by coils/windings (5) of electrical conductors (8) and (10). In the very simplified illustration of the FIGURE, an incoming electrical conductor (8) enters within the housing (2) via a bushing (7), and an outgoing electrical conductor (10) exits the housing (2) via a bushing (10). The transformer (1), or other electrical equipment in which the fluid is used, may e.g. be a high temperature transformer, arranged to operate at a temperature which is higher than the normal operating temperature of mineral oil derived insulating fluid, e.g. an operating temperature of above, 160° C., 180° C. or above 200° C.

In recent years, there has been a growing interest in installing electrical installations on the sea floor in depths from a few tens of meters to even kilometers. Subsea oil and gas production employs electric equipment like drilling motors, pumps, and compressors that are currently driven by frequency converters located on topside platforms. Electric power is provided to the subsea machinery by expensive umbilicals. By installing transformers, breakers, frequency converters and other electric power equipment subsea, cables and topside installations could be spared and enormous cost savings could be achieved.

In bringing electric power at subsea depths, two general concepts exist: (1) the equipment stays at atmospheric pressure; and (2) the equipment is pressurized to the hydrostatic pressure level on seabed. The two concepts can be differentiated as follows. Concept (1) has the advantage that standard electric components, known from onshore installations, can be used, while disadvantages include thick walls needed for the enclosure to withstand the pressure difference between inside and outside. Thick walls make the equipment heavy and costly. In addition, heat transfer through thick walls is not very efficient and huge, expensive cooling units are required. Concept (2) has the advantage that no thick walls are needed for the enclosure since no pressure difference exists between inside and outside the containment. Cooling is greatly facilitated by thin walls. Disadvantages of concept (2) are that all the components must be free of gas inclusions and compressible voids, otherwise they implode during pressurization and are destroyed. By using the electrically insulating fluid comprising isoparaffin, with advantageous properties at high pressures, i.e. lower viscosity and higher thermal conductivity, than commonly used oils or esters, the subsea installation and operation of insulating fluid containing electrical equipment can be made more reliable In some embodiments, the electrical equipment is installed below the water/sea surface i.e. subsea, the electrical equipment is an electrical transformer, an electrical motor, a capacitor, a circuit breaker pole, a frequency converter, a reactor or a bushing. The fluid is envisioned to be advantageously used in transformers, but also used in other electrical equipment.

In some embodiments the electrical equipment is installed inside a housing (2) containing the electrically insulating fluid (3) and one or more parts of the electrical equipment are immersed in the insulating fluid (3) and in this case the electrical equipment can be, for example, power electronic modules.

EXAMPLE

The insulating isoparaffin fluid according to the present invention may be a dielectric liquid e.g. fluid, which is derived from terpenes. Dielectric fluids based on terpenes or derived from terpenes (i.e. a fluid according to the present invention) may have the following advantageous properties in addition to a cost that is similar to mineral oil.

Renewable feedstock is used
High biodegradability (>65%)
Excellent kinematic viscosities (adjustable between 2 cSt to >12 cSt at 100° C. and <30 cSt at 40° C.)
High flash points (>210° C.)
Low pour points (<−30° C.)
Better heat transfer capabilities compared to mineral oil
Superior oxidation stability
Lower viscosity and higher thermal conductivity at high pressures The present disclosure has mainly been described above with reference to a few embodiments. However, as is readily appreciated by a person skilled in the art, other embodiments than the ones disclosed above are equally possible within the scope of the present disclosure, as defined by the appended patent claims.

The invention claimed is:
1. An electrically insulating fluid comprising isoparaffins derived from a renewable carbon source in an electrical equipment, the fluid having a flash point of at least 220° C. and comprising at least 70 wt % of the isoparaffins.

2. The fluid according to claim 1, comprising at least 90 wt % of the isoparaffins.

3. The fluid according to claim 1, with a biodegradability of at least 65% or at least 95% according to OECD 301B.

4. The fluid according to claim 1, wherein the isoparaffins have been derived from the renewable carbon source by means of micro organisms or algae, such as bacteria, yeast or algae.

5. The fluid according to claim 1, wherein the isoparaffins have been derived from terpenes or unsaturated compounds obtained from the renewable carbon source.

6. The fluid according to claim 5, wherein the isoparaffins have been derived from terpenes by means of micro organisms or algae, such as bacteria, yeast or algae.

7. The fluid according to claim 1, wherein the renewable carbon source is biomass, such as sugar cane, molasses or cellulose pulp.

8. The fluid according to claim 1, wherein the fluid has a pour point of less than −25° C. in accordance with ASTM D 5950.

9. The fluid according to claim 1, wherein the fluid has a kinematic viscosity at 100° C. in the range 2 cSt to 10 cSt.

10. The fluid according to claim 1, wherein the fluid also comprises one or more additives, such as an antioxidant or a pour point depressant.

11. The fluid according to claim 1, wherein the electrical equipment is an electrical transformer, an electrical motor, a capacitor, a reactor or a bushing.

12. An electrical equipment having an electrically insulating fluid comprising
isoparaffins derived from a renewable carbon source, the fluid having a flash point of at least 220° C. and comprising at least 70 wt % of the isoparaffins.

13. The electrical equipment of claim 12, wherein the electrical equipment is an electrical transformer, an electrical motor, a circuit breaker pole, a frequency converter selected from the group comprising, a capacitor, a reactor, a bushing, or a combination of these.

14. The electrical equipment of claim 12, wherein the electrical equipment is installed and operated subsea.

15. The electrical equipment of claim 14, wherein the electrical equipment is installed inside a housing containing the electrically insulating fluid and one or more parts of the electrical equipment are immersed in the insulating fluid.

16. The fluid according to claim 1, wherein the electrical equipment is installed and operated subsea.

17. The fluid according to claim 1, wherein the electrical equipment is installed inside a housing containing the electrically insulating fluid and one or more parts of the electrical equipment are immersed in the insulating fluid.

18. A transformer comprising:
a housing;
a metal core inside the housing, the metal core surrounded by windings;
the fluid according to claim 1 inside the housing, the metal core immersed in the fluid;
the transformer pressurized to a hydrostatic pressure level on a seabed.

19. The electrical equipment of claim 14, wherein the electrical equipment is pressurized to a hydrostatic pressure level on a seabed.

* * * * *